(12) United States Patent
Nobinger et al.

(10) Patent No.: US 6,358,809 B1
(45) Date of Patent: Mar. 19, 2002

(54) METHOD OF MODIFYING PROPERTIES OF DEPOSITED THIN FILM MATERIAL

(75) Inventors: Glenn Nobinger, Santa Clara, CA (US); Alexander Kalnitsky, Portland, OR (US); Melvin Schmidt; Jonathan Herman, both of San Jose, CA (US); Viktor Zekeriya, Palo Alto, CA (US); Vijaykumar Ullal, Saratoga, CA (US); Daniel H. Rosenblatt, San Carlos, CA (US); Joseph P. Ellul, San Jose, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/764,812

(22) Filed: Jan. 16, 2001

(51) Int. Cl.$^7$ ................................................. H01L 21/20
(52) U.S. Cl. ....................... 438/382; 438/238; 438/385
(58) Field of Search ........................ 438/238, 381–385

(56) References Cited

U.S. PATENT DOCUMENTS 5,899,740 A  *  5/1999  Kwon ......................... 438/627

FOREIGN PATENT DOCUMENTS

JP          62-237724 A  * 10/1987
JP          07-202124 A  *  8/1995

* cited by examiner

*Primary Examiner*—Jey Tsai
(74) *Attorney, Agent, or Firm*—Blakely, Sokoloff, Taylor & Zafman LLP

(57) ABSTRACT

A method of modifying a layer of thin film composite material to achieve one or more desired properties for the thin film layer which cannot be achieved by heat treatment at all practical temperatures of operation allowable by particular integrated circuit processes. In particular, the thin film composite material is subjected to an ion implantation process. Depending on the doping species, the doping concentration, the doping energy, and other ion implantation parameters, one or more properties of the deposited thin film resistive layer can be modified. Such properties may include electrical, optical, thermal and physical properties. For instance, the sheet resistance and/or the temperature coefficient of resistance of the thin film composite material may be increased or decreased by appropriately implanting ions into the material. The ion implantation can be applied globally in order to modify one or more properties of the entire deposited thin film composite layer. Alternatively, the ion implantation can be applied regionally in order to modify the thin film composite material at a first region, not modify the thin film composite material at a second region, and/or modify the thin film composite material in another way at a third region.

34 Claims, 4 Drawing Sheets

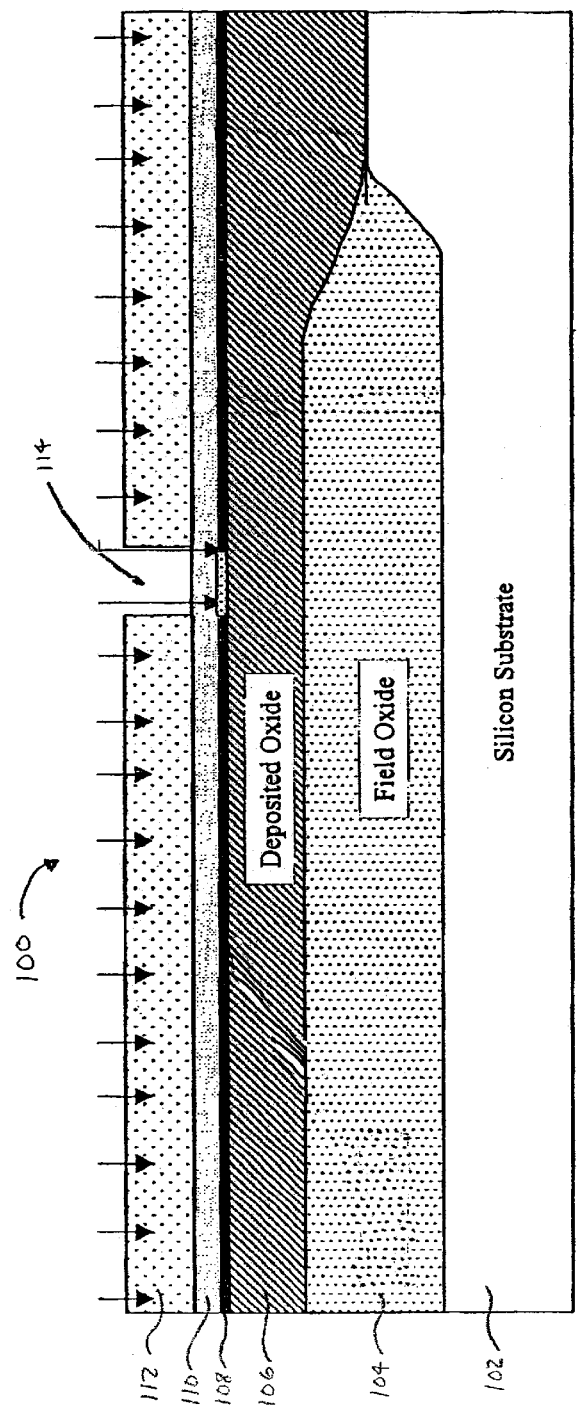
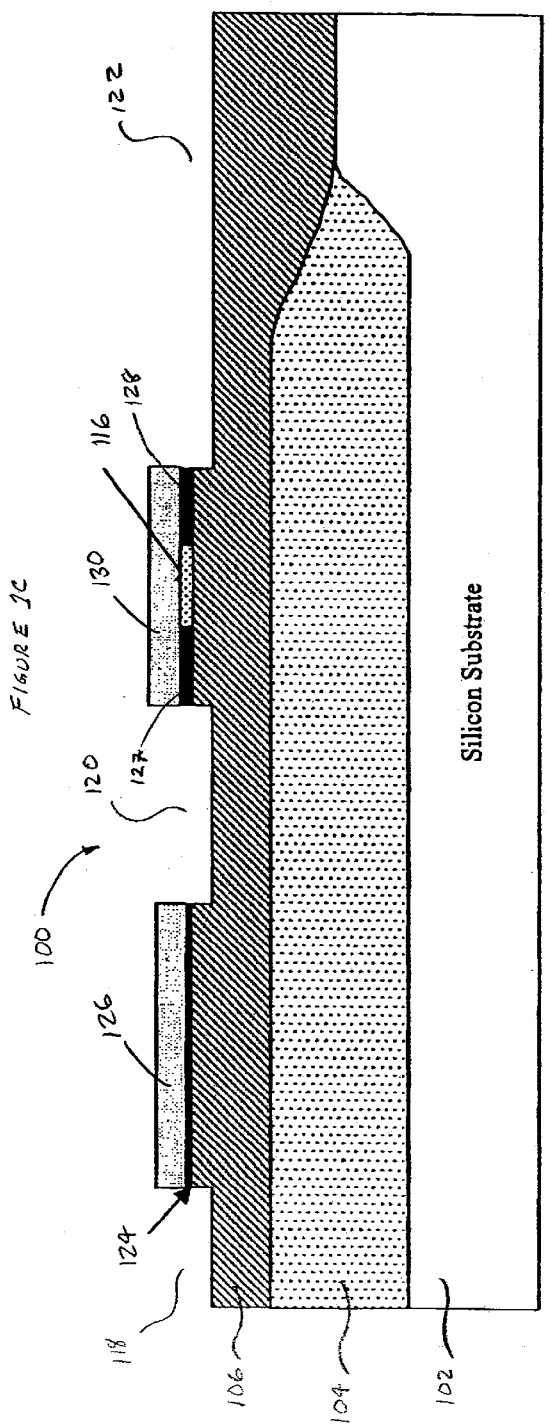

METHOD OF MODIFYING PROPERTIES OF DEPOSITED THIN FILM MATERIAL

FIELD OF THE INVENTION

This invention generally relates to semiconductor processing and, in particular, to a method of modifying one or more properties of a thin film composite material by ion implantation. These properties may pertain to the bulk or to the surface of the thin film and may include resistivity, temperature coefficient of resistance, optical transparency, transparency in other non-optical wavelengths or interfacial properties with other materials.

BACKGROUND OF THE INVENTION

Thin film composite materials, such as thin film resistors, are employed in many integrated circuits. These resistors are used in integrated circuits to implement the desired functionally of the circuit, including biasing of active devices, serving as voltage dividers, assisting in impedance matching, etc. They are typically formed by deposition of a resistive material on a dielectric layer, and subsequently patterned to a desired size and shape. Deposition of resistive material can be performed by any deposition means, such as by sputtering. Often, a thin film resistor is subjected to a heat treatment process which may be part of the overall integrated circuit process. This heat process, often referred to as "annealing", may improve thin film material stability and may alter some, none or all of the various other properties to various degrees. In particular, annealing may alter film resistivity and temperature coefficient of resistance.

In general, the properties of the as-deposited thin film composite material are fixed. That is, when deposited the thin film material will exhibit particular electrical, optical, thermal and physical properties which may or may not be altered by heat treatment. These properties may include the sheet resistance, temperature coefficient of resistance, optical transparency, transparency in other non-optical wavelengths, physical properties, and other properties. Generally, these properties are set by the material composition of the composite or mosaic target used to sputter the thin-film material on the surface of the wafer. The degree of alteration of these properties by annealing does not occur in a proportionate manner, that is, some properties may be altered by a large factor while others may be altered significantly less.

However, there is a need to alter some or all of these properties after the thin film composite materials is deposited on the surface of the wafer. Annealing at a particular temperature may not be possible due to inherent limitations of the integrated circuit or the degree of alteration may not be as much as required. For instance, there may be a need to modify the sheet resistance of the deposited thin film material more than can be achieved by annealing without modifying other properties. Similarly, there may be a need to modify the temperature coefficient resistance of the annealed film alone. There may be a further need to modify other electrical, thermal, optical and physical properties of the deposited thin film composite material. Additionally, there may be a need to perform these modifications on only selected regions of the deposited Mm Furthermore, there may be a need to modifiat two or more properties of the deposited thin film composite material in respectively different manners with one or more process steps.

These needs and others are met by the method of modifying properties of deposited thin-film resistive material in accordance with the invention.

SUMMARY OF THE INVENTION

An aspect of the invention relates to a method of modifying a layer of thin film composite material to achieve one or more desired properties for the thin film layer which cannot be achieved by heat treatment at all practical temperatures of operation allowable by particular integrated circuit processes. In particular, the thin film composite material is subjected to an ion implantation process. Depending on the doping species, the doping concentration, the doping energy, and other ion implantation parameters, one or more properties of the deposited thin film layer can be modified. Such properties may include electrical, optical, thermal and physical properties. These properties may be modified linearly or non-linearly. For instance, the sheet resistance and/or the temperature coefficient of resistance of the thin film composite material may be increased or decreased by appropriately implanting ions into the material. The ion implantation can be applied globally in order to modify one or more properties of the entire thin film composite layer. Alternatively, the ion implantation can be applied regionally in order to modify the thin film composite material at a particular region, not modify the thin film composite material at a second region, and/or modify the thin film composite material in another way at a third region by performing a different ion implantation on the third region.

Other aspects, features, and techniques of the invention will become apparent to one skilled in the relevant art in view of the following detailed description of the invention.

BRIEF DESCRIPTION OF THE DRAWINGS

FIG. 1C illustrates a cross-sectional view of the exemplary integrated circuit at a subsequent step of the method of modifying a deposited thin film composite material in accordance with the invention;

FIG. 1D illustrates a cross-sectional view of the exemplary integrated circuit at a subsequent step of the method of modifying a deposited thin film composite material in accordance with the invention;

DETAILED DESCRIPTION OF THE INVENTION

Figure 1A:
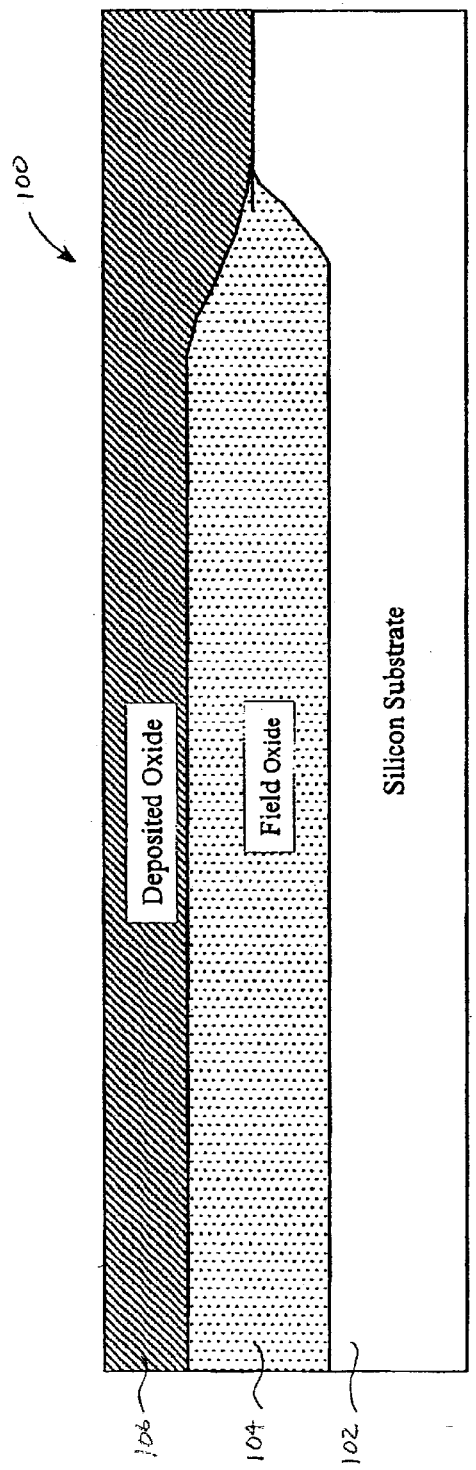
FIG. 1A illustrates a cross-sectional view of an exemplary integrated circuit at an intermediate step of a method of modifying a deposited thin film composite material in accordance with the invention.

FIG. 1A illustrates a cross-sectional view of an exemplary integrated circuit 100 at an intermediate step of a method of modifying a deposited thin film composite material in accordance with the invention. At this intermediate step, the integrated circuit 100 comprises a silicon substrate 102, a field oxide 104 formed partially within and above the silicon substrate 104, and a dielectric layer 106 (e.g. an oxide) formed over the field oxide 104 and over the substrate 102 at the active region. The field oxide 104 may be formed by local oxidation of silicon (LOCOS) techniques and in a manner that forms a well controlled thickness of the field oxide 104. In addition, the dielectric layer 106 may comprise a layer of deposited glass ($SiO_2$) which is subsequently planarized to achieve a relatively smooth top surface and a specified thickness optimal for laser trimming of the thin film composite material. Other materials may be substituted for the oxide layer 106, but the thickness and optical properties of the material should be adjusted for optimum laser trimming purposes.

Figure 1B:
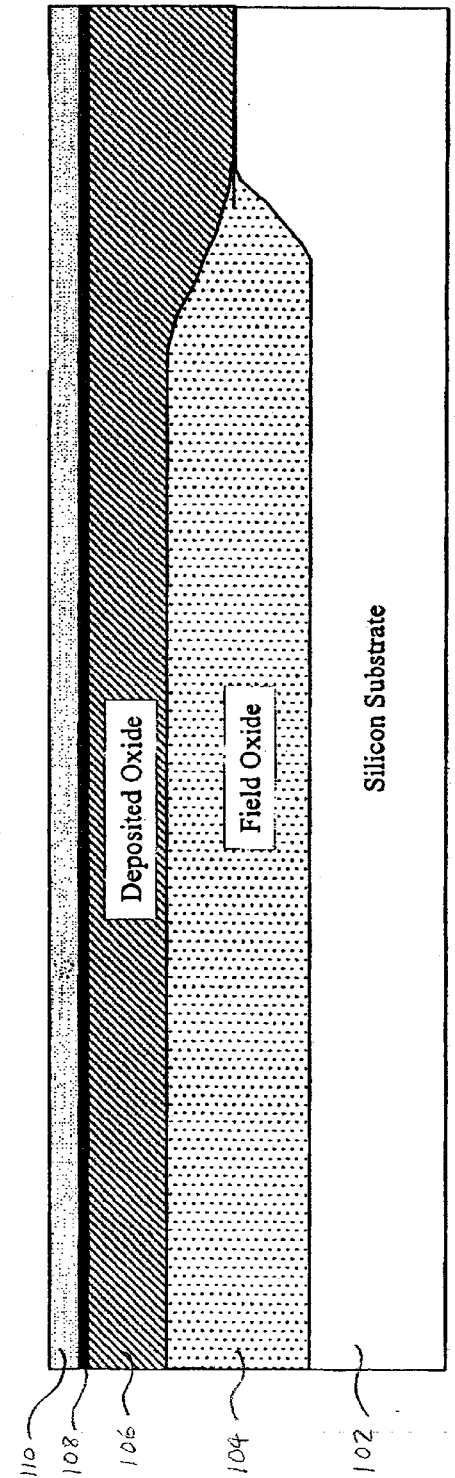
FIG. 1B illustrates a cross-sectional view of the exemplary integrated circuit at a subsequent step of the method of modifying a deposited thin film composite material in accordance with the invention.

FIG. 1B illustrates a cross-sectional view of the exemplary integrated circuit 100 at a subsequent step of the method of modifying a deposited thin film composite material in accordance with the invention. In this subsequent step of the method, a layer of thin film composite material 108 is formed over the oxide layer 106, and a layer of an oxide overcoat 110 (i.e. another dielectric layer) is deposited over the thin film composite material 108. The thin film composite material 108 may comprise resistive materials such as chromium-silicon (CrSi), tantalum-nitride (TaN), nickel-chromium (NiCr), or other suitable thin film composite materials, or conductive materials such as titanium-tungsten (TiW), suicides, or other suitable conductive materials. Chromium-silicon (CrSi) is typically deposited by sputtering from a pre-prepared target. The target composition, deposited thickness, subsequent temperature anneal, and stress-level due to materials underlying and overlying the chromium-silicon (CrSi) thin film composite material 108 contribute to the final properties of the material, such as the sheet resistance, the temperature coefficient of resistance, and others. In this example, the oxide overcoat 110 may be 50 to 100 nanometers thick.

FIG. 1C illustrates a cross-sectional view of the exemplary integrated circuit 100 at a subsequent step of the method of modifying a deposited thin film composite material in accordance with the invention. In this subsequent step, one or more properties of the thin film composite material 108 will be modified. More specifically, a layer of photo resist 112 is formed over the oxide overcoat 110, and subsequently patterned and etched to form window 114 through which the one or more properties of the underlying thin film composite material 108 will be modified in accordance with the invention. The integrated circuit 100 is then subjected to an ion implantation process to alter one or more properties of the region of the thin film composite material 108 underlying the photo resist window 114.

The implant species and dose are selected to modify one or more properties of the exposed thin film composite material to respective desired levels. For example, the sheet resistance, temperature coefficient of resistance, optical transparency, transparency in other non-optical wavelengths, physical properties, and others properties may be modified using this method. This example illustrates the local film modification where only the region of the thin film composite material underlying the photo resist window 114 is modified. The thin film composite material can also be subjected to global film modification by eliminating the photo resist steps, and subjecting the entire deposited thin film composite material 108 to the ion implantation process. After the ion implantation step, the photo resist 112 is stripped and the wafer is cleaned.

FIG. 1D illustrates a cross-sectional view of the exemplary integrated circuit 100 at a subsequent step of the method of modifying a deposited thin film composite material in accordance with the invention. In this subsequent step, another layer of photo resist (not shown) is deposited over the oxide overcoat 110, and subsequently patterned and etched to form windows 118, 120, and 122 over regions of the oxide overcoat 110 and thin film composite material 108 to be etched. Then the integrated circuit 100 undergoes an etching process to remove the oxide overcoat 110 and the thin film composite material 108 underlying windows 118, 120 and 122. What remains after this step is an unmodified thin film island 124 overlaid by an island of oxide overcoat 126, and an island comprising a modified thin film composite material 116 sandwiched between a pair of unmodified thin film composite materials 127 and 128 all overlaid by an island of oxide overcoat 130.

Figure 1E:
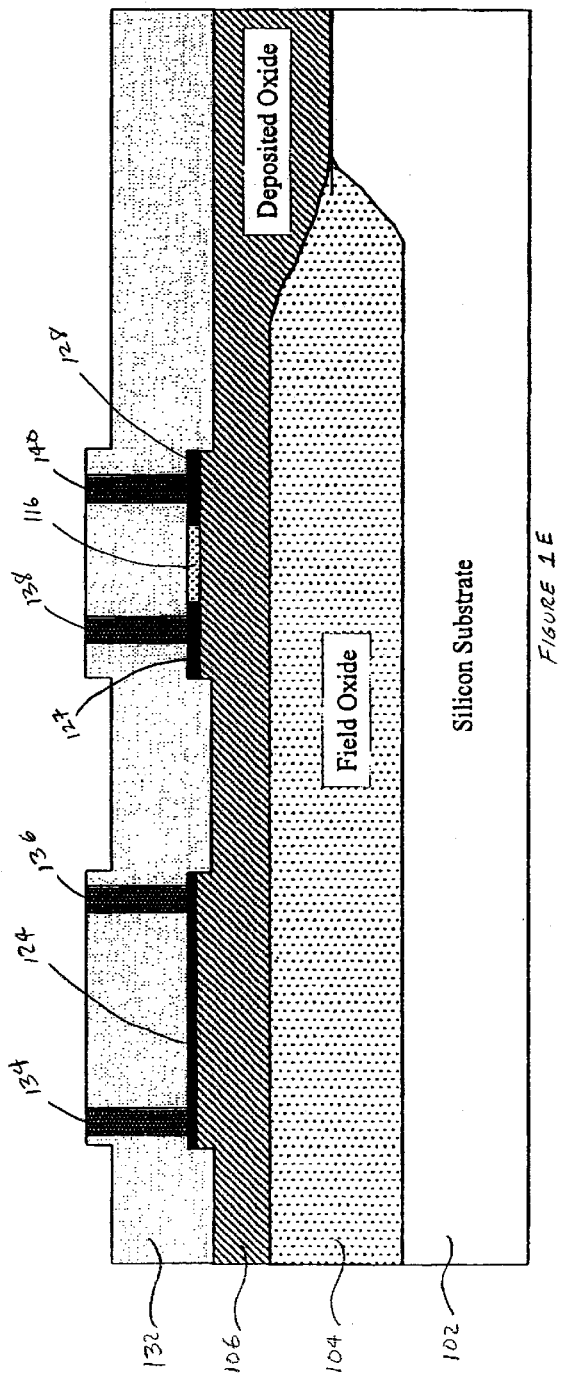
FIG. 1E illustrates a cross-sectional view of the exemplary integrated circuit at a subsequent step of the method of modifying a deposited thin film composite material in accordance with the invention.

FIG. 1E illustrates a cross-sectional view of the exemplary integrated circuit 100 at a subsequent step of the method of modifying a deposited thin film composite material in accordance with the invention. In this subsequent step, another dielectric overcoat 132 is formed over the integrated circuit 100 and subsequently a pair of contacts 134 and 136 are formed through the dielectric overcoat 132 to contact both ends of the unmodified Win film island 124, and another pair of contacts 138 and 140 are formed through the oxide overcoat 132 to contact the unmodified thin film materials 127 and 128 of the island having the modified thin film material 116. As FIG. 1E illustrates, the different thin film materials 124 and 116 have been formed with composite material 124 unmodified and composite material 116 modified by the ion implantation process in accordance with the invention.

Figure 2:
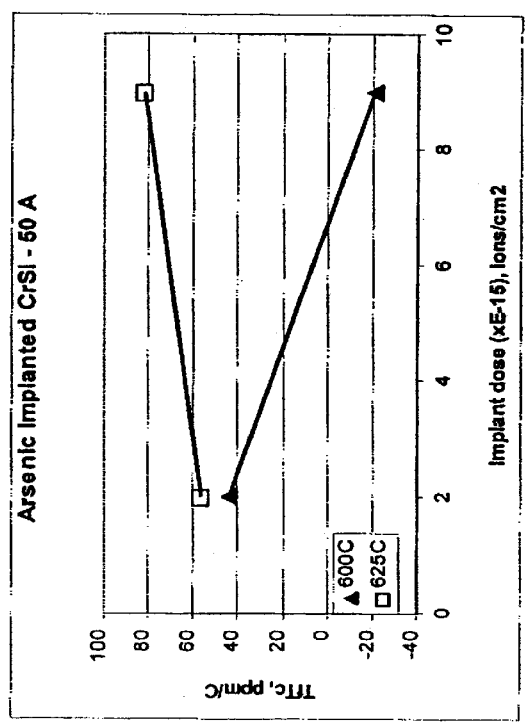
FIG. 2 illustrates an exemplary graph depicting the change in the temperature coefficient of resistance of a chromium-silicon (CrSi) thin film composite material with doping concentration of arsenic at two different annealing temperatures.

FIG. 2 illustrates an exemplary graph depicting the change in the temperature coefficient of resistance of a 50 Angstrom-thick chromium-silicon (CrSi) thin film composite material with doping concentration of arsenic at two different annealing temperatures 600 and 625 degrees Celsius. The graph illustrates that for the annealing temperature of 600 degrees Celsius, the temperature coefficient of resistance of the deposited chromium-silicon material decreases as the arsenic doping concentration in the material is increased. On the other hand, for an annealing temperature of 625 degrees Celsius, the temperature coefficient of resistance of the deposited chromium-silicon material increases as the arsenic doping concentration in the material is increased. By using graphs like this one, a layer of chromium-silicon (CrSi) material can be modified in accordance with the invention to achieve a desired temperature coefficient of resistance for the material.

Figure 3:
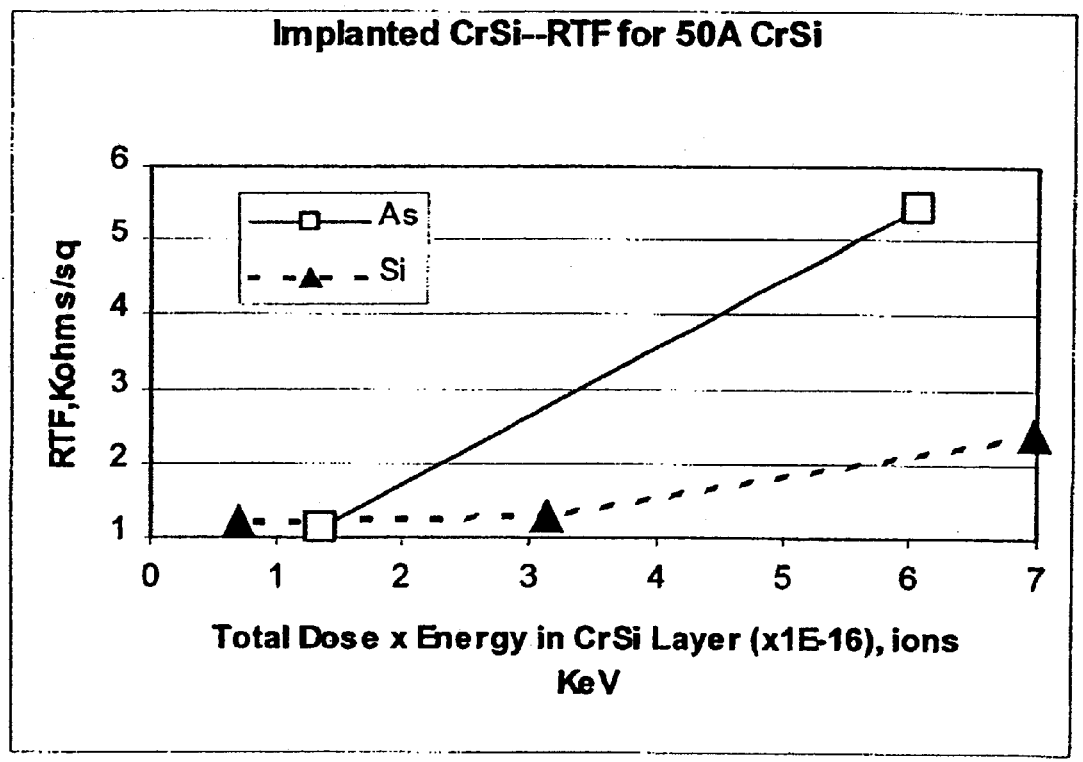
FIG. 3 illustrates an exemplary graph depicting the change in the sheet resistance of a chromium-silicon (CrSi) thin film composite material with respective doping concentrations of arsenic and silicon.

FIG. 3 illustrates an exemplary graph depicting the change in the sheet resistance of a 50 Angstrom-thick chromium-silicon (CrSi) thin file composite material with respective dose-energy of arsenic and silicon. The graph illustrates that the sheet resistance of chromium-silicon (CrSi) increases with a relatively large slope as the implanting dose-energy of arsenic increases. On the other hand, for a silicon doping species the sheet resistance of chromium-silicon (CrSi) stays relatively constant from dose-energy of 0.8 to $3 \times 10^{16}$ ions-KeV, and increases at a relatively small slope above dose-energy levels above $3 \times 10^{16}$ ions-KeV. By using graphs like this one, a layer of chromium-silicon (CrSi) material can be modified in accordance with the invention to achieve a desired sheet resistance for the material.

Figure 4:
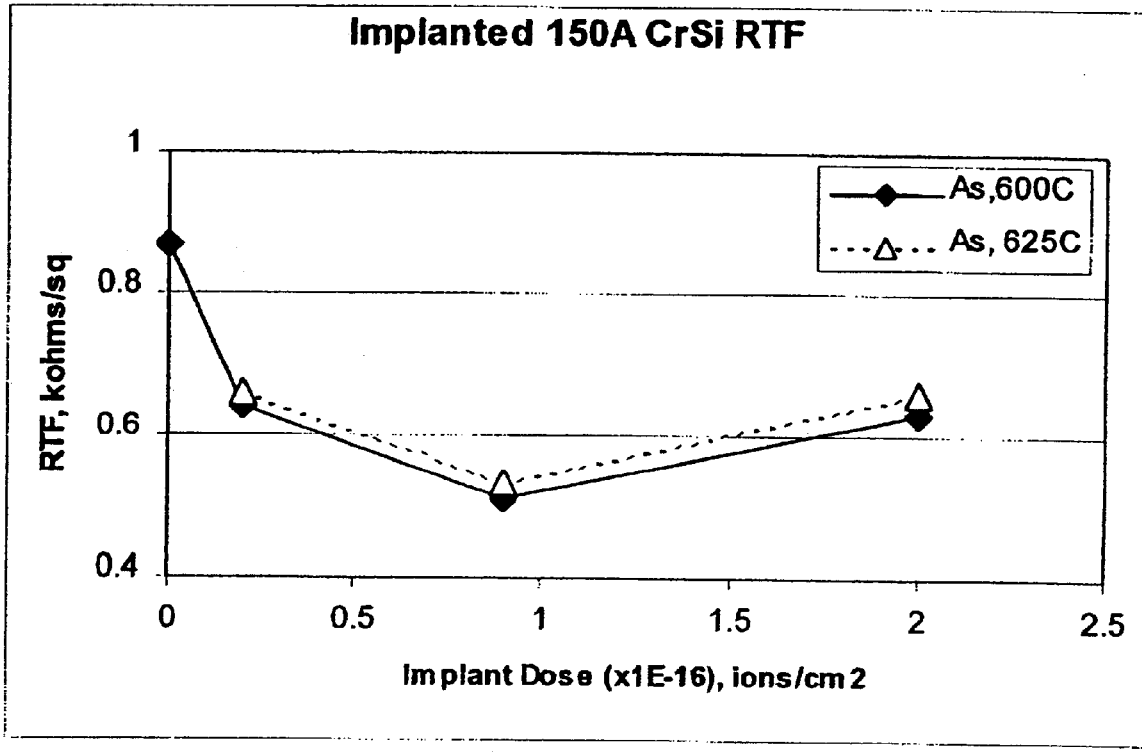
FIG. 4 illustrates an exemplary graph depicting the change in the sheet resistance of a chromium-silicon (CrSi) thin film composite material with doping concentration of arsenic at two different annealing temperatures.

FIG. 4 illustrates an exemplary graph depicting the change in the sheet resistance of a chromium-silicon (CrSi)

thin film composite material with doping concentration of arsenic at two different annealing temperatures. The graph illustrates that the sheet resistance for both annealing temperatures of 600 and 625 decreases as the doping concentration of arsenic increases from 0 to about $0.9 \times 10^{16}$ ions per centimeter square, and increases gradually above $0.9 \times 10^{16}$ ions per centimeter square. By using graphs like this one, a layer of chromium-silicon (CrSi) material can be modified in accordance with the invention to achieve a desired sheet resistance for the material. The graphs depicted in FIGS. 1–3 are merely examples of how a thin film composite material can be modified by an ion implantation process in accordance with the invention. Other properties of thin film composite material including optical and transparency at other wavelengths can be modified in accordance with the invention.

There are several advantages of the method of modifying a thin film composite material of the invention. For instance, two or more different regions of thin film composite material in an integrated circuit can be made to have different properties and serve different functions. For example, one region may be doped to achieve a low sheet resistance for application as a fuse. Another region may be doped to obtain a desired temperature coefficient of resistance. Another technique is to modify sheet resistance dynamically to correct base film drifts. There are multitudes of applications that the method of the invention can be used for.

In the foregoing specification, the invention has been described with reference to specific embodiments thereof. It will, however, be evident that various modifications and changes may be made thereto departing from the broader spirit and scope of the invention. The specification and drawings are, accordingly, to be regarded in an illustrative rather than a restrictive sense.

It is claimed:

1. A method of forming an integrated circuit using a substrate having a field oxide layer and a first dielectric layer disposed on said field oxide layer, comprising:

forming a layer of thin film resistive material over said first dielectric layer, wherein said resistive material includes first and second undesired properties;

forming a second dielectric layer over said thin film resistive material layer;

forming a window through said second dielectric layer; and implanting ions into a region of said thin film resistive layer that underlies said window to modify said first and second undesired properties of said thin film composite material layer to first and second desired properties, respectively.

2. The method of claim 1, wherein forming said window comprises:

forming a layer of photo resist over said second dielectric layer;

patterning said layer of photo resist; and etching said layer of photo resist to form said window.

3. The method of claim 1, wherein said first desired property includes a sheet resistance of said thin film resistive material.

4. The method of claim 1, wherein said first desired property includes a temperature coefficient of resistance of said thin film resistive material, and said second desired property includes a sheet resistance of said thin film resistive material.

5. The method of claim 1, wherein said implanting ions comprises:

selecting a species to dope said thin film resistive material; and doping said thin film resistive material with said species to a doping concentration that results in said first and second desired properties of said thin film resistive material.

6. The method of claim 1, wherein said ion implanting process comprises:

selecting a species to dope said thin film resistive material; and doping said thin film resistive material with said species to a dopeenergy level that results in said first and second desired properties for said thin film resistive material.

7. The method of claim 1, wherein said thin film resistive material comprises chromium-silicon (CrSi).

8. The method of claim 1, wherein said thin film resistive material comprises tantalum-nitride (TaN).

9. The method of claim 1, wherein said thin film resistive material comprises nickel-chromium (NiCr).

10. The method of claim 1, further including forming a thin film resistive material island comprising said modified region of said thin film resistive material interposed between a pair of unmodified regions of said thin film resistive material.

11. The method of claim 10, further including forming a dielectric island over said thin film resistive material island from said second dielectric layer.

12. The method of claim 11, further comprising:

forming a third dielectric over said dielectric island; and forming a pair of contacts to said respective pair of unmodified regions of said thin film resistive material through said third dielectric and said dielectric island.

13. The method of claim 11, further comprising forming a second thin film resistive material island from said thin film resistive material.

14. The method of claim 13, further comprising forming a second dielectric island over said second thin film resistive material island.

15. The method of claim 14, further comprising:

forming a third dielectric over said dielectric island and said second dielectric island; and forming a first pair of contacts to said respective pair of unmodified regions of said thin film resistive material through said third dielectric and said dielectric island; and forming a second pair of contacts to two different regions of said second thin film resistive material island through said third dielectric and said second dielectric island.

16. The method of claim 1, wherein implanting ions into said region is performed after said thin film composite layer has undergone an annealing process.

17. A method of forming a thin film composite material having first and second desired properties, comprising:

forming a layer of thin film composite material over a surface of a substrate, wherein said thin film composite material has first and second undesired properties; and subjecting said thin film composite material to an ion implantation process to modify said first undesired property to said second desired property, and modify said second undesired property to said second desired property.

18. The method of claim 17, wherein said first desired property includes a sheet resistance of said thin film composite material.

19. The method of claim 17, wherein said first desired property includes a temperature coefficient of resistance of said thin film composite material.

20. The method of claim 17, wherein said ion implantation process comprises:
   selecting a species to dope said thin film composite material; and
      doping said thin film composite material with said species to a doping concentration that results in said first and second desired properties for said thin film composite material.

21. The method of claim 17, wherein said ion implantation process comprises:
   selecting a species to dope said thin film composite material; and
      doping said thin film composite material with said species to a dope-energy level that results in said first and second desired properties for said thin film composite material.

22. The method of claim 17, wherein said thin film composite material comprises chromium-silicon (CrSi).

23. The method of claim 17, wherein said thin film composite material comprises tantalum-nitride (TaN).

24. The method of claim 17, wherein said thin film composite material comprises nickel-chromium (NiCr).

25. The method of claim 17, wherein subjecting said thin film composite material is performed after said thin film composite material has undergone an annealing process.

26. A method of forming a thin film resistive material having first and second desired properties, comprising:
   forming a layer of thin film resistive material over a surface of a substrate, wherein said thin film resistive material has first and second undesired properties; and
   subjecting said thin film composite material to an ion implantation process to modify said first and second undesired properties to said first and second desired properties.

27. The method of claim 26, wherein said first desired property includes a sheet resistance of said thin film resistive material.

28. The method of claim 26, wherein said first desired property includes a temperature coefficient of resistance of said thin film material, and said desired property includes a sheet resistance of said thin film resistive material.

29. The method of claim 26, wherein said ion implantation process comprises:
   selecting a species to dope said thin film resistive material; and
      doping said thin film resistive material with said species to a doping concentration that results in said first and second desired properties for said thin film resistive material.

30. The method of claim 26, wherein said ion implantation process comprises:
   selecting a species to dope said thin film resistive material; and
      doping said thin film resistive material with said species to a dose-energy level that results in said first and second desired properties for said thin film resistive material.

31. The method of claim 26, wherein said thin film resistive material comprises chromium-silicon (CrSi).

32. The method of claim 26, wherein said thin film resistive material comprises tantalum-nitride (TaN).

33. The method of claim 26, wherein said thin film resistive material comprises nickel-chromium (NiCr).

34. The method of claim 26, wherein subjecting said thin film resistive material is performed after said thin film resistive material has undergone an annealing process.

* * * * *